(12) United States Patent
Ewald et al.

(10) Patent No.: US 11,978,136 B2
(45) Date of Patent: May 7, 2024

(54) FUNCTIONAL MAGNETIC RESONANCE IMAGING ARTIFACT REMOVAL BY MEANS OF AN ARTIFICIAL NEURAL NETWORK

(71) Applicant: KONINKLIJKE PHILIPS N.V., Eindhoven (NL)

(72) Inventors: Arne Ewald, Hamburg (DE); Nick Flaeschner, Hamburg (DE); Bernhard Gleich, Hamburg (DE); Ingmar Graesslin, Boenningstedt (DE); Peter Boernert, Hamburg (DE); Ingo Schmale, Hamburg (DE); Johannes Adrianus Overweg, Uelzen (DE)

(73) Assignee: Koninklijke Philips N.V., Eindhoven (NL)

( * ) Notice: Subject to any disclaimer, the term of this patent is extended or adjusted under 35 U.S.C. 154(b) by 361 days.

(21) Appl. No.: 17/299,804

(22) PCT Filed: Nov. 26, 2019

(86) PCT No.: PCT/EP2019/082520
§ 371 (c)(1),
(2) Date: Jun. 4, 2021

(87) PCT Pub. No.: WO2020/114830
PCT Pub. Date: Jun. 11, 2020

(65) Prior Publication Data
US 2022/0028133 A1    Jan. 27, 2022

(30) Foreign Application Priority Data

Dec. 7, 2018 (EP) .................................... 18211002

(51) Int. Cl.
*G06T 11/00* (2006.01)
*G01R 33/48* (2006.01)
(Continued)

(52) U.S. Cl.
CPC ........ *G06T 11/008* (2013.01); *G01R 33/4806* (2013.01); *G01R 33/5608* (2013.01);
(Continued)

(58) Field of Classification Search
CPC ... G06T 11/008; G06T 2210/41; G06N 3/045; G06N 3/044; G01R 33/4806; G01R 33/5608; G01R 33/56509
See application file for complete search history.

(56) References Cited

U.S. PATENT DOCUMENTS 8,315,962 B1    11/2012  Horne
10,890,641 B2 *   1/2021  Wang .................. A61B 5/0042
(Continued)

OTHER PUBLICATIONS

Anderson et al "Common Component Classification: What we can learn from Machine Learning" NeuroImage vol. 56, Issue 2, May 15, 2011 p. 517-524.
(Continued)

*Primary Examiner* — Shefali D Goradia

(57) ABSTRACT

The invention provides for a medical imaging system (100, 400) comprising a memory (110) storing machine executable instructions (120) and a configured artificial neural network (122). The medical imaging system further comprises a processor (104) configured for controlling the medical imaging system. Execution of the machine executable instructions causes the processor to receive (200) magnetic resonance imaging data (124), wherein the magnetic resonance imaging data is BOLD functional magnetic resonance imaging data descriptive of a time dependent BOLD signal (1100) for each of a set of voxels. Execution of the machine executable instructions further causes the processor to construct (202) a set of initial signals (126) by reconstructing the time dependent BOLD signal for each of the set of voxels using the magnetic resonance imaging data. Execution of the machine executable instructions further
(Continued)

causes the processor to receive (204) a set of modified signals (128) in response to inputting the set of initial signals into the configured artificial neural network. The configured artificial neural network is configured for removing physiological artifacts from the set of initial signals.

14 Claims, 14 Drawing Sheets

(51) Int. Cl.
  *G01R 33/56* (2006.01)
  *G01R 33/565* (2006.01)
  *G06N 3/044* (2023.01)
  *G06N 3/045* (2023.01)

(52) U.S. Cl.
  CPC ....... *G01R 33/56509* (2013.01); *G06N 3/044* (2023.01); *G06N 3/045* (2023.01); *G06T 2210/41* (2013.01)

(56) References Cited

U.S. PATENT DOCUMENTS

| | | | |
|---|---|---|---|
| 2006/0018524 A1* | 1/2006 | Suzuki | G06F 18/254 382/128 |
| 2018/0143275 A1* | 5/2018 | Sofka | G06T 7/0012 |
| 2019/0378293 A1* | 12/2019 | Mwikirize | A61B 5/7267 |

OTHER PUBLICATIONS

Sachin et al "ICA Components Classification of FMRI Data Using Neural Networks" International Journal of Engineering Science Invention Research and Development Jan. 1, 2017 p. 371-376.

Salimi-Khorshidi Gholamreza et al "Automatic Denoising of Functional MRI Data . . . " Neuroimage, vol. 90, Jan. 2, 2014 p. 449-468.

G. Yourganov, J. Fridriksson, B. Stark, and C. Rorden, "Removal of artifacts from resting-state fMRI data in stroke," NeuroImage: Clinical, vol. 17, pp. 297-305, Jan. 2018.

Tohka et al "Automatic Independent Component Labeling for Artifact removal in fMRI" Neuroimage, 39 (2008) p. 1227-1245.

Xu et al "Denoising the Speaking Brain: toward a robust Technique for Correcting Artifact Contaminated fMRI Data Under Severe Motion" Neuroimage, 103 (2014) p. 33-47.

Ash et al "Detection of Physiological Noise in Resting State fMRI Using Machine Learning" Human Brain Mapping 34: p. 985-998 (2013).

Wang et al "Dimensionality of ICA in Resting State fMRI Investigated by Feature Optimized Classification of Independent Components with SVM" Frontiers in Human Research May 2015, vol. 9, article 259.

Pruim et al "ICA_AROMA A Robust ICA based strategy for removing motion artifacts from fMRI Data" Neuroimage 112 (2015) p. 267-277.

Huf et al "On the Generalizability of Resting State fMRI Machine Learning Classifiers" Frontiers in Neuroimage Jul. 29, 2015.

Search Report and Written Opinion from PCT/EP2019/082520 dated Jun. 11, 2020.

* cited by examiner

400 Medical imaging system (System)
402 Magnetic resonance imaging system (MRI)
404 Magnet
406 Bore of magnet (B)
408 Imaging zone (Z)
409 Region of interest (ROI)
410 Magnetic field gradient coils (GCs)
412 Magnetic field gradient coil power supply (GC PS)
414 Radio-frequency coil
416 Transceiver
418 Subject
420 Subject support
430 Pulse sequence commands 600 Recurrent neural network
602 Input
604 Output
606 Direct feedback or hidden layer neurons 600 Recurrent neural network
602 Input
604 Output
606 Direct feedback or hidden layer neurons
700 Input computational layer
702 Inputs of layer inputs
800 Output computational layer
802 Outputs of output computational layer

FUNCTIONAL MAGNETIC RESONANCE IMAGING ARTIFACT REMOVAL BY MEANS OF AN ARTIFICIAL NEURAL NETWORK

CROSS REFERENCE TO RELATED APPLICATIONS

This application is a U.S. national phase application of International Application No. PCT/EP2019/082520 filed on Nov. 26, 2019, which claims the benefit of EP Application Ser. No. 18211002.3 filed on Dec. 7, 2018 and is incorporated herein by reference.

FIELD OF THE INVENTION

The invention relates to magnetic resonance imaging, in particular to functional magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a subject. This large static magnetic field is referred to as the B0 field or the main magnetic field. Various quantities or properties of the subject can be measured spatially using MRI. Various imaging protocols can be implemented by using pulse sequences to control the acquisition of magnetic resonance data and can be used to measure various properties of a subject.

For example, in functional Magnetic Resonance Imaging (fMRI) brain activity is measured using magnetic resonance imaging. A common type of functional magnetic resonance imaging is blood-oxygen-level dependent (BOLD) contrast. BOLD imaging relies on the properties of oxygenated and deoxygenated hemoglobin. Oxygenated hemoglobin is paramagnetic and deoxygenated hemoglobin is diamagnetic. T2* weighted pulse sequences can therefore detect changes in the oxygenation of blood in the brain. However, the BOLD effect is small and the contrast of a T2* weighted image changes by only a few percent. Patient motion caused by breathing or heart motion can least to changes in the contrast that also is of the order of a few percent. In order to perform BOLD magnetic resonance imaging this physiological noise needs to be removed from the signal.

The journal article Anderson et. al., "Common component classification: What can we learn from machine learning?," NeuroImage, Volume 56, Issue 2, 15 May 2011, Pages 517-524 discloses Machine learning methods have been applied to classifying fMRI scans by studying locations in the brain that exhibit temporal intensity variation between groups, frequently reporting classification accuracy of 90% or better. Machine learning classifiers were created and then used to deconstruct a classifier to examine its sensitivity to physiological noise, task reordering, and across-scan classification ability. The models are trained and tested both within and across runs to assess stability and reproducibility across conditions. The use of independent components analysis for both feature extraction and artifact removal were demonstrated.

SUMMARY OF THE INVENTION

The invention provides for a medical imaging system, a computer program product, and a method.

As mentioned above functional magnetic resonance imaging signals can easily be obscured by physiological artifacts. The typical way of removing this noise from functional magnetic resonance imaging data is to monitor physiological processes of the subject such as breathing and heart motion. This enables removal of the physiological artifacts. Embodiments may simplify this process by using a configured artificial neural network to automatically remove physiological artifacts. The physiological neural network can be trained to remove physiological artifacts without the need to sensors to monitor breathing or heart motion.

In one aspect the invention provides for a medical imaging system that comprises a memory storing machine-executable instructions. The medical imaging system further comprises a processor configured for controlling the medical imaging system by executing of the machine executable instructions. Execution of the machine-executable instructions causes the processor to receive magnetic resonance imaging data. The magnetic resonance imaging data is functional magnetic resonance imaging data descriptive of a time dependent signal for each of a set of voxels. E.g. the magnetic resonance imaging data comprises data which is descriptive of each voxel individually and this data contains a time dependent signal. Execution of the machine-executable instructions further causes the processor to construct a set of initial signals by reconstructing the time dependent signal for each of the set of voxels using the magnetic resonance imaging data.

The set of initial signals has the time dependent signal for each of the set of voxels. Execution of the machine-executable instructions further causes the processor to receive a set of modified signals in response to inputting the set of initial signals into a configured artificial neural network. The configured artificial neural network is configured for removing physiological artifacts from the set of initial signals. This embodiment may be beneficial because functional magnetic resonance imaging is particularly susceptible to physiological artifacts which are artifacts that are caused by physiological changes or motion of the subject.

It should be noted that the set of modified signals could either be the pure noise signal from the set of initial signals or it could be the signal with the noise removed. These two are essentially equivalent.

In another embodiment the medical imaging system further comprises a magnetic resonance imaging system configured for acquiring the magnetic resonance imaging data according to a time dependent functional magnetic resonance imaging protocol. Execution of the machine-executable instructions further causes the processor to control the magnetic resonance imaging system to acquire the magnetic resonance imaging data.

In another embodiment the configured artificial neural network comprises a recurrent neural network for each of the set of voxels. The use of a recurrent neural network for each voxel may be beneficial because the signal for each of the set of voxels is time dependent. The use of a recurrent neural network enables the processing of this signal in the time domain.

The recurrent neural network for each of the voxels may have a number or multiple layers. These multiple layers may include different types such as partially connected layers, and also convolutional layers.

In another embodiment the configured artificial neural network comprises an input computational layer. The recurrent neural network of each of the voxels comprises an input connected to the input computational layer. In this embodiment instead of the data being input directly into the individual recurrent neural networks the input is first input into the input computational layer and then the inputs of the recurrent neural networks are connected into this. This may be beneficial because such effects as blood flow and the movement of other voxels and other such cooperative behavior may be better modeled using the input computational layer.

In another embodiment, the set of modified signals is one of a set of noise signals and a set of clean signals. The set of initial signals is the measured time dependent BOLD signal for each of the voxels. There is a time dependent BOLD signal for each voxel. The set of initial signals also has noise due to the physiological artifacts. The set of noise signals is the noise component of the set of initial signals and the set of cleaned signals is the set of time dependent signals without the noise component. The neural network is configured for removing the physiological artifact or the noise. Having a configured neural network that produces the set of cleaned signals is equivalent to a configured neural network that produces the set of noise signals.

In another embodiment, the neural network comprises a plurality of recurrent neural networks, and wherein the recurrent neural network of each of the set of voxels form the plurality of recurrent neural networks. The For each of the set of voxels there is an individual or separate recurrent neural network.

In another embodiment the use of a partially connected layer may be used to specify the effect of voxels within a particular distance or radius of a particular voxel. This may be useful in representing local effects.

In another embodiment the configured artificial neural network comprises an output computational layer. The recurrent neural network of each voxel comprises an output connected to the output computational layer. This embodiment may also be beneficial because the output of neighboring voxels may be considered when providing the output. This may provide for a more efficient or better removal of the noise signal.

In another embodiment the output computational layer is fully connected.

In another embodiment the output layer is convolutionally connected.

In another embodiment the output computational layer is partially connected.

In another embodiment, the recurrent neural network of each voxel comprises a direct feedback or direct feedback loop. The direct feedback can be individual signals fed back into the recurrent neural network as feedback for the next iteration or feedback provided via a hidden layer within the recurrent neural network. The configured artificial neural network comprises a hidden feedback layer. The direct feedback of the recurrent neural network of each voxel is provided via the hidden feedback layer.

In this embodiment instead of the direct feedback of the recurrent neural network being fed directly to itself the direct feedback of the recurrent neural network goes through an intermediate layer which is able to combine and/or distribute the feedback from multiple recurrent neural networks. This may aid in the modeling of effects which affect more than one voxel.

In another embodiment the hidden feedback layer comprises at least one fully connected layer.

The hidden feedback layer comprises at least one convolutional layer.

In another embodiment execution of the machine-executable instructions further causes the processor to receive a set of training signals for each of the set of voxels. Execution of the machine-executable instructions further causes the processor to receive a set of clean signals for each of the set of voxels. The set of training signals comprises the set of clean signals plus physiological artifacts. Execution of the machine-executable instructions further causes the processor to receive physiological artifact data descriptive of subject motion. The physiological artifact data is movement data. The movement data is time correlated to the set of clean signals.

Execution of the machine-executable instructions further causes the processor to train the configured artificial neural network using the set of training signals, the clean signals, and the physiological artifact data. These training steps may be beneficial because they may be able to train the configured artificial neural network to remove physiological artifact data without the physiological artifact data present. For example if a breathing or heart rate sensor provides the physiological artifact data the resulting configured artificial neural network may be able to remove this noise from the set of initial signals without the physiological artifact data or sensor data being present.

In another embodiment execution of the machine-executable instructions further causes the processor to receive a noise reduction value. Execution of the machine-executable instructions further causes the processor to construct a controllably clean set of signals using the set of initial signals, the modified signals, and the noise reduction value. As was mentioned before the set of modified signals may contain either the clean signal or the signal with the noise. Either way, using that in conjunction with the set of initial signals the amount of noise removed can be dynamically or controllably adjusted. For example, if the set of modified signals contains just the noise signal, the controllably clean set of signals can be constructed by multiplying the noise reduction value times the set of modified signals and then subtracting that from the set of initial signals. Conversely, if the set of modified signals are the signals which have been cleaned of the noise, a similar operation can be performed with a result that is equivalent.

In another embodiment, if the set of modified signals is a set of noise signals then constructing the controllably cleaned set of signals comprises subtracting the multiple of the noise reduction value times the set of modified signals from the set of initial signals.

In another embodiment, if the set of modified signals is a set of cleaned signals then constructing the controllably cleaned set of signals comprises: calculating a set of noise signals by subtracting the set of modified signals from the set of initial signals; and constructing the controllably cleaned set of signals by subtracting the multiple of the noise reduction value times the set of noise signals from the set of initial signals.

In another embodiment, execution of the machine executable instructions further causes the processor to reconstruct a BOLD magnetic resonance image from the set of modified signals. This could be performed directly using the set of modified signals if they are a set of cleaned signals. If the set of modified signals are a set of noise signals, then the set of cleaned signals can be calculated by subtracting the set of modified signals from the set of modified signals.

In another embodiment execution of the machine-executable instructions further causes the processor to reconstruct a functional magnetic resonance image from the controllably cleaned set of signals. This may be beneficial because it may enable the operator to adjust for the optimum signal in the resulting functional magnetic resonance image.

In another embodiment execution of the machine-executable instructions further causes the processor to reconstruct a functional magnetic resonance image from the set of modified signals. For example, if the set of modified signals comprises the signal with all of the noise removed by the configured artificial neural network.

In another embodiment the recurrent neural network for each of the set of voxels is a long short-term memory neural network. The use of a long short-term memory neural network may be beneficial because it may provide for better removal of artifacts that are correlated in time.

In another embodiment the magnetic resonance imaging data is BOLD functional magnetic resonance imaging data descriptive of a time dependent BOLD signal for each of the set of voxels. This may be particularly beneficial because the BOLD functional magnetic resonance imaging is particularly susceptible to physiological artifacts. For example, the movement of the subject due to respiration or the heart may cause distortions which are on the same order as the BOLD signal. The BOLD signal is typically a few percent of the signal. This is also of the same order of magnitude as noise caused by physiological movement or artifacts.

In another aspect the invention provides for a method of operating a medical imaging system. The method comprises receiving magnetic resonance imaging data. The magnetic resonance imaging data is functional magnetic resonance imaging data descriptive of a time dependent signal for each of a set of voxels. The method further comprises constructing a set of initial signals by reconstructing the time dependent signal for each of the set of voxels using the magnetic resonance imaging data. The method further comprises receiving a set of modified signals in response to inputting the set of initial signals into a configured artificial neural network. The configured artificial neural network is configured for removing physiological artifacts from the set of initial signals.

In another aspect the invention provides for a method of training the configured artificial neural network. The method first comprises receiving a set of training signals for each of the set of voxels. The method further comprises receiving a set of clean signals for each of the set of voxels. The set of training signals comprises the set of clean signals plus physiological artifacts. The method further comprises receiving physiological artifact data descriptive of subject motion. The physiological artifact data is movement data. The movement data is time correlated to the set of clean signals. The method further comprises training the configured artificial neural network using the set of training signals, the clean signals, and the physiological artifact data.

In another embodiment, the set of training signals comprises sequential data points. Execution of the machine executable instructions causes the processor to train the configured artificial neural network such that the set of clean signals is sequentially offset a predetermined number of iterations. This training causes the recurrent neural networks to delay outputting the set of modified signals by the predetermined number of iterations. This may have the advantage that the recurrent neural networks use several samples of the set of initial signals to produce the set of modified signals.

In another aspect the invention provides for a computer program product comprising machine-executable instructions for execution by a processor. Execution of the machine-executable instructions causes the processor to receive magnetic resonance imaging data. The magnetic resonance imaging data is functional magnetic resonance imaging data descriptive of a time dependent signal for each of a set of voxels. Execution of the machine-executable instructions further causes the processor to reconstruct a set of initial signals by reconstructing the time dependent signal for each of the set of voxels using the magnetic resonance imaging data. The method further comprises receiving a set of modified signals in response to inputting the set of initial signals into a configured artificial neural network. The configured artificial neural network is configured for moving physiological artifacts from the set of initial signals.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid-state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments, computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance Imaging data is defined herein as being the recorded measurements of radio frequency signals emitted by atomic spins using the antenna of a Magnetic resonance apparatus during a magnetic resonance imaging scan. A Magnetic Resonance Imaging (MRI) image or MR image is defined herein as being the reconstructed two- or three-dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
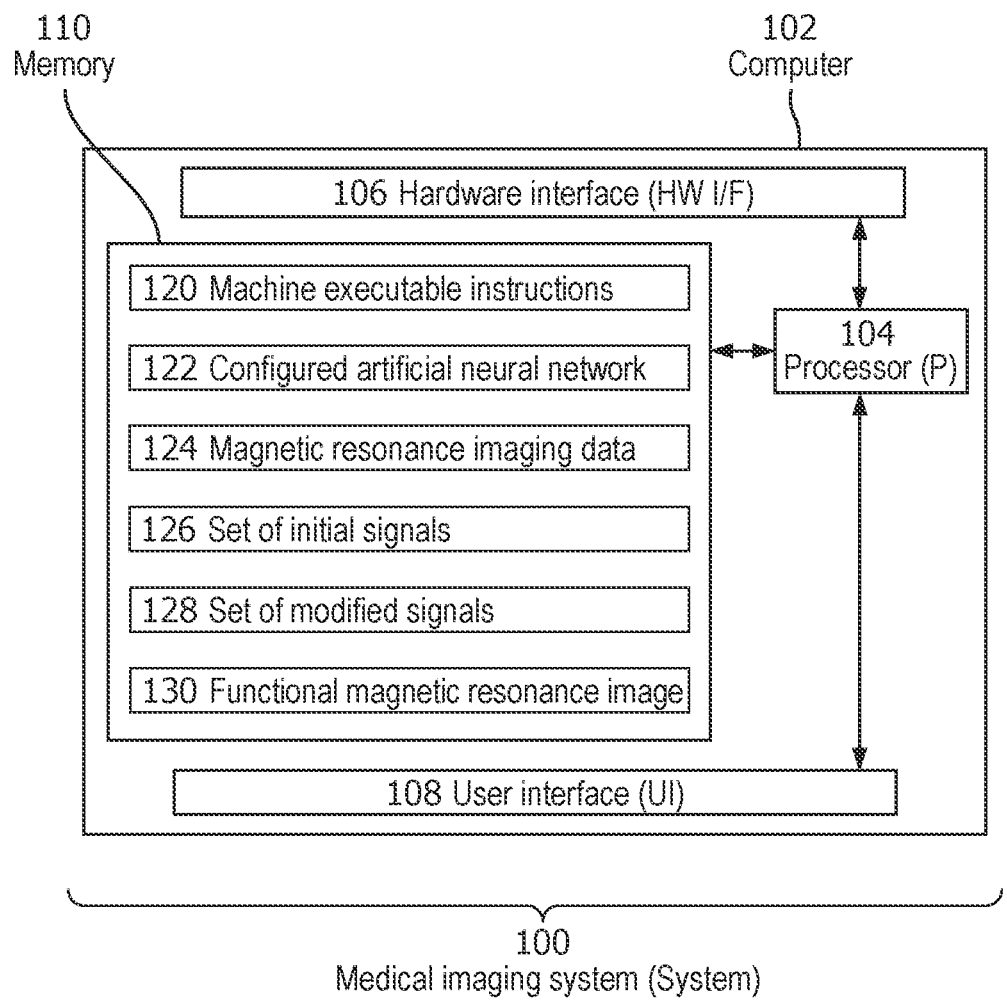
FIG. 1 illustrates an example of a medical imaging system.

FIG. 1 illustrates an example of a medical imaging system 100. The medical imaging system 100 comprises a computer 102. The computer comprises a processor 104. The processor 104 is intended to represent one or more processors or processing cores and may also be distributed amongst multiple computers. The processor is shown as being connected to an optional hardware interface 106, an optional user interface 108, and a memory 110. The hardware interface 106 may enable the processor 104 to send and receive signals or information to other components of the medical imaging system 100 and control them.

The hardware interface 106 may also be a network interface and may enable the processor 104 to exchange data and/or instructions with other computer systems. The user interface 108 may enable the display of data and/or rendering of images. The user interface 108 may also be used by an operator to control the operation and function of the medical imaging system. The memory 110 is any memory which is accessible to the processor 104. The memory 110 may include volatile and non-volatile memory. The entries in the memory 110 may be copied or duplicated within multiple modalities of memory such as being in main memory as well as being stored on a hard drive or other computer storage medium.

The memory 110 is shown as containing machine-executable instructions 120. Execution of the machine-executable instructions 120 by the processor 104 enables the processor 104 to control the various components of the medical imaging system. The execution of the machine-executable instructions may also enable the processor 104 to perform various data and numerical computations and data processing.

The memory 110 is further shown as containing a configured artificial neural network 122. The configured artificial neural network is configured for removing physiological artifacts from time dependent functional magnetic resonance imaging signals. An example would be the removal of noise from so called BOLD magnetic resonance imaging signals. The memory 110 is further shown as containing magnetic resonance imaging data 124. The magnetic resonance imaging data 124 is functional magnetic resonance imaging data descriptive of a time dependent signal for each of a set of voxels. The memory 110 is further shown as containing a set of initial signals 126 that was reconstructed from the magnetic resonance imaging data 124. Each of the set of signals 126 is time dependent signals and there is a signal for each of the set of voxels. The memory 110 further contains a set of modified signals 128 that has been received in response to inputting the set of initial signals 126 into the configured artificial neural network 122.

In different examples the set of modified signals 128 could take different forms. In one example the set of modified signals is the time dependent functional magnetic resonance imaging signals with the noise removed. In another example the set of modified signals 128 is the noise component. The memory 110 is further shown as containing a functional magnetic resonance image 130 that has been reconstructed using at least one the set of modified signals 128. In some examples both the set of modified signals 128 and the set of initial signals 126 are used to construct the functional magnetic resonance image 130.

Figure 3:
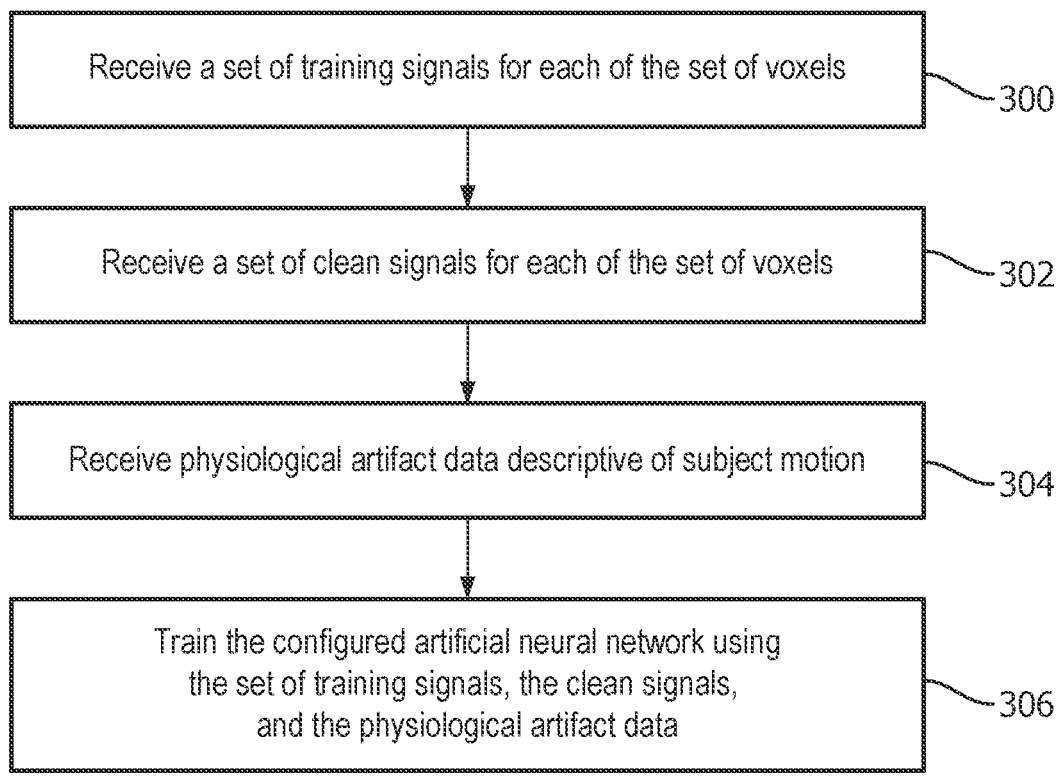
FIG. 3 shows a flow chart which illustrates a method of training the configured artificial neural network.

FIG. 3 shows a flowchart which illustrates a method of operating the medical imaging system 100 of FIG. 1. First in step 200, the magnetic resonance imaging data 124 is received. The magnetic resonance imaging data is functional magnetic resonance imaging data that is descriptive of a time dependent signal for each of the set of voxels. Next in step 202, a set of initial signals is constructed by reconstructing the time dependent signal for each of the set of voxels using the magnetic resonance imaging data 124. Then in step 204, the set of initial signals 126 are input into the configured artificial neural network 122. In response the configured artificial neural network 122 then outputs the set of modified signals 128. The method then may perform optional step number 206. In step 206 a functional magnetic resonance image 130 is constructed using at least the set of modified signals 128.

FIG. 3 shows a flowchart which illustrates a method of training or configuring the configured artificial neural network 122 of FIG. 1. First in step 300, a set of training signals is received for each of the set of voxels. Next in step 302, a set of clean signals is received for each of the set of voxels. The set of training signals comprises the set of clean signals plus physiological artifacts or noise. Then in step 304, physiological artifact data descriptive of subject motion is received. The movement data is time correlated to the set of clean signals. Finally, in step 206, the configured artificial neural network is trained using the set of training signals, the clean signals, and the physiological artifact data. The training method illustrated in FIG. 3 may be performed before the configured artificial neural network 122 is deployed to the medical imaging system 100. In other examples the training method illustrated in FIG. 3 is performed using the medical imaging system 100. This may be before the initial use of the configured artificial neural network 122 and/or it may be continual training as more data and training signals become available.

Figure 4:
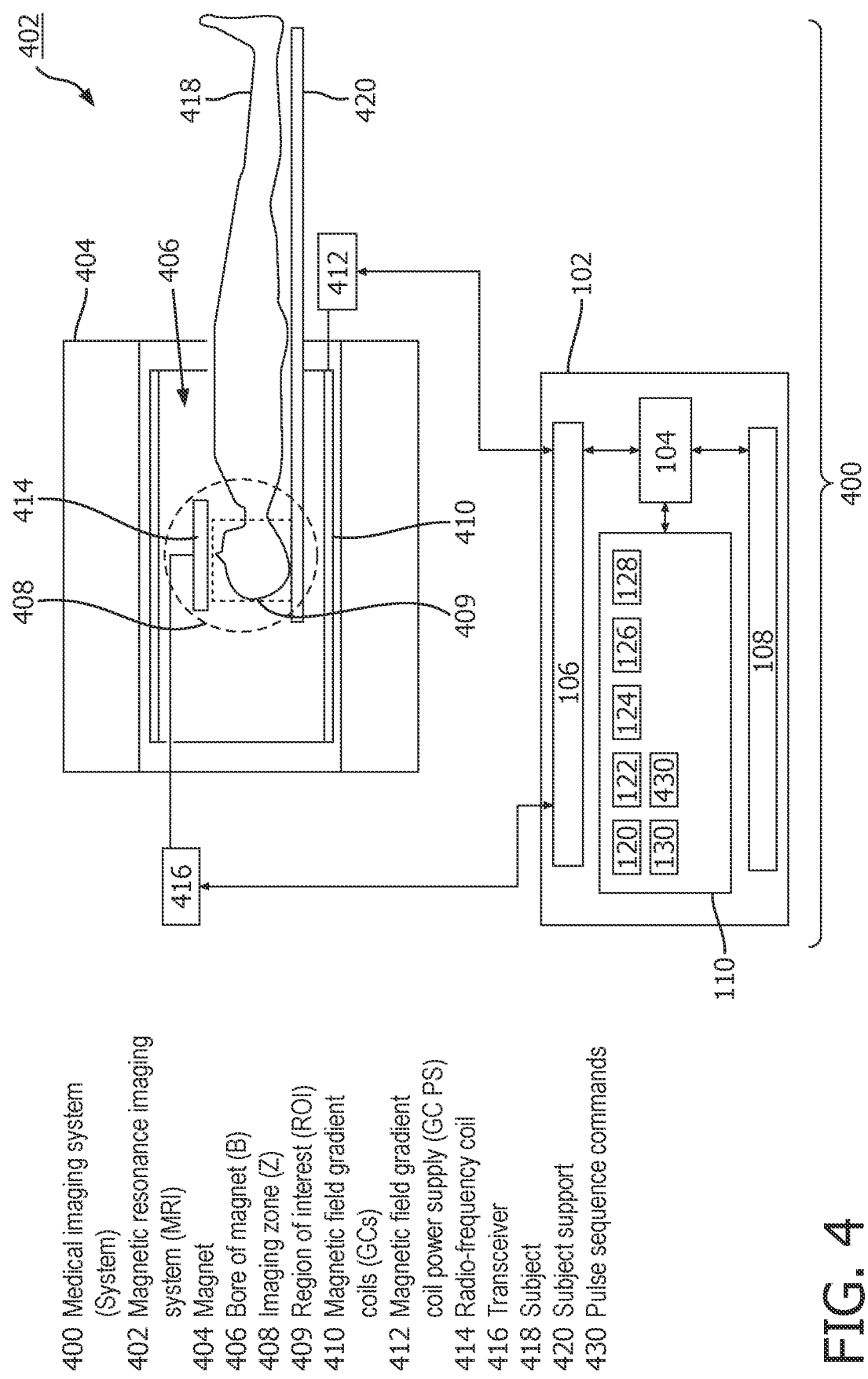
FIG. 4 illustrates a further example of a medical imaging system.

FIG. 4 illustrates a further example of medical imaging system 400. The medical imaging system 400 illustrated in FIG. 4 is similar to that in FIG. 1 except it additionally comprises a magnetic resonance imaging system 402. The magnetic resonance imaging system 402 comprises a magnet 404. The magnet 404 is a superconducting cylindrical type magnet with a bore 406 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 406 of the cylindrical magnet 404 there is an imaging zone 408 where the magnetic field is strong and uniform enough to perform magnetic resonance imaging. A region of interest 409 is shown within the imaging zone 408. The magnetic resonance data that is acquired typically acquired for the region of interest. A subject 418 is shown as being supported by a subject support 420 such that at least a portion of the subject 418 is within the imaging zone 408 and the region of interest 409.

Within the bore 406 of the magnet there is also a set of magnetic field gradient coils 410 which is used for acquisition of preliminary magnetic resonance data to spatially encode magnetic spins within the imaging zone 408 of the magnet 404. The magnetic field gradient coils 410 connected to a magnetic field gradient coil power supply 412. The magnetic field gradient coils 410 are intended to be representative. Typically magnetic field gradient coils 410 contain three separate sets of coils for spatially encoding in three orthogonal spatial directions. A magnetic field gradient power supply supplies current to the magnetic field gradient coils. The current supplied to the magnetic field gradient coils 410 is controlled as a function of time and may be ramped or pulsed.

Adjacent to the imaging zone 408 is a radio-frequency coil 414 for manipulating the orientations of magnetic spins within the imaging zone 408 and for receiving radio transmissions from spins also within the imaging zone 408. The radio frequency antenna may contain multiple coil elements. The radio frequency antenna may also be referred to as a channel or antenna. The radio-frequency coil 414 is connected to a radio frequency transceiver 416. The radio-frequency coil 414 and radio frequency transceiver 416 may be replaced by separate transmit and receive coils and a separate transmitter and receiver. It is understood that the radio-frequency coil 414 and the radio frequency transceiver 416 are representative. The radio-frequency coil 414 is intended to also represent a dedicated transmit antenna and a dedicated receive antenna. Likewise, the transceiver 416 may also represent a separate transmitter and receivers. The radio-frequency coil 414 may also have multiple receive/transmit elements and the radio frequency transceiver 416 may have multiple receive/transmit channels. For example, if a parallel imaging technique such as SENSE is performed, the radio-frequency could 414 will have multiple coil elements.

In this example the subject, 418 is positioned such that the subject's head region is within the region of interest 409 for performing functional magnetic resonance imaging.

The transceiver 416 and the gradient controller 412 are shown as being connected to a hardware interface 106 of the computer system 102. The memory 110 is shown as further containing a set of pulse sequence commands 430. The pulse sequence commands 430 are configured for controlling the magnetic resonance imaging system to acquire the magnetic resonance imaging data 124 according to a functional magnetic resonance imaging protocol that measures a time dependent signal for each of the set of voxels. For example, if the functional magnetic resonance imaging technique is the BOLD technique, then the pulse sequence commands 430 may be configured for making accurate measurements of $T2^*$.

Figure 2:
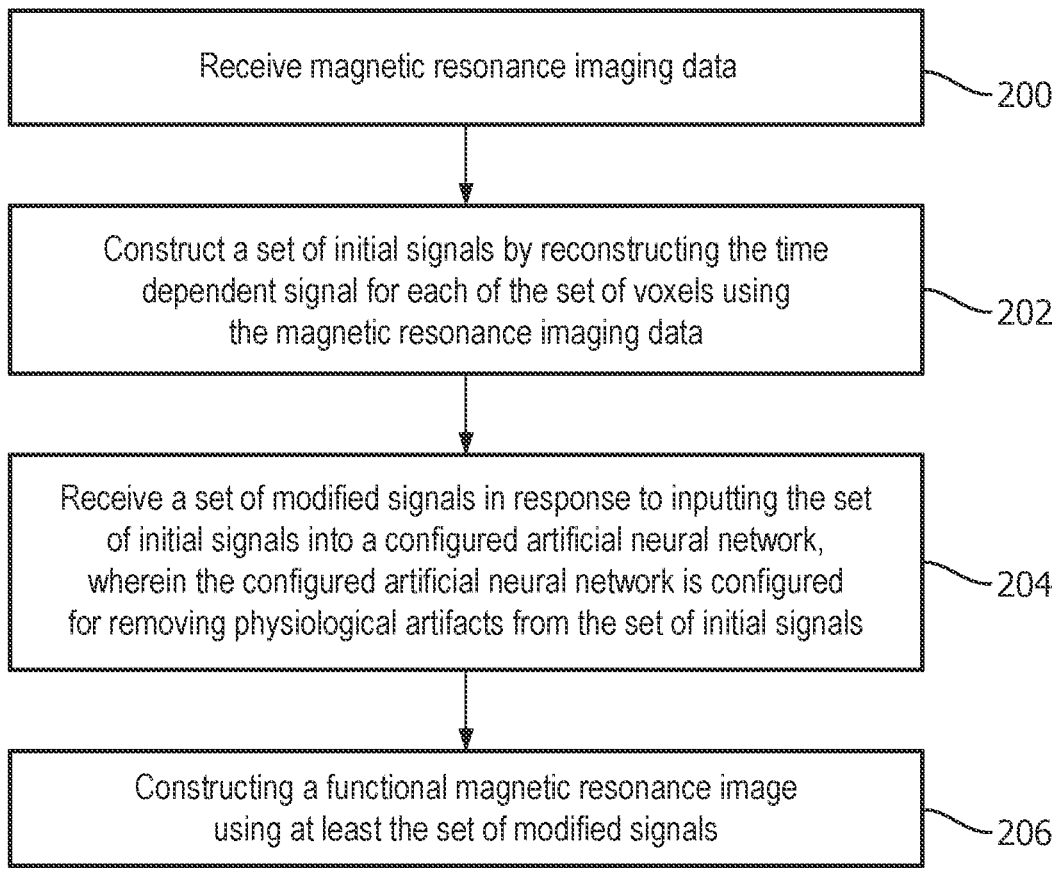
FIG. 2 shows a flow chart which illustrates a method of operating the medical imaging system of FIG. 1.
Figure 5:
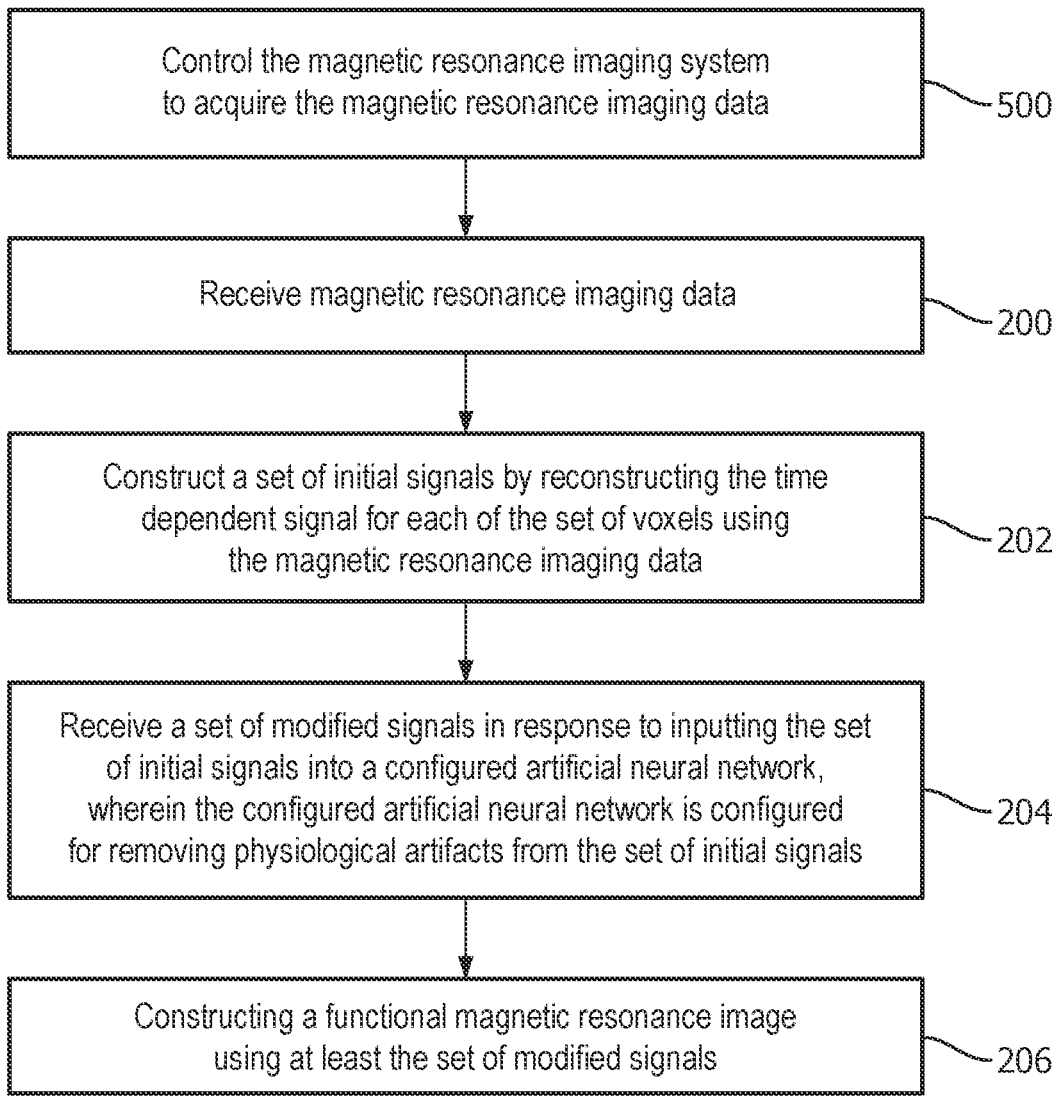
FIG. 5 shows a flow chart which illustrates a method of operating the medical imaging system of FIG. 4.

FIG. 5 shows a flowchart which illustrates a method of operating the medical imaging system 400 of FIG. 4. The method starts with step 500. In step 500 the processor 104 controls the magnetic resonance imaging system 402 with the pulse sequence commands 430 to acquire the magnetic resonance imaging data 124. The method then proceeds to steps 200, 202, 204, and 206 as was described in FIG. 2.

Figure 6:
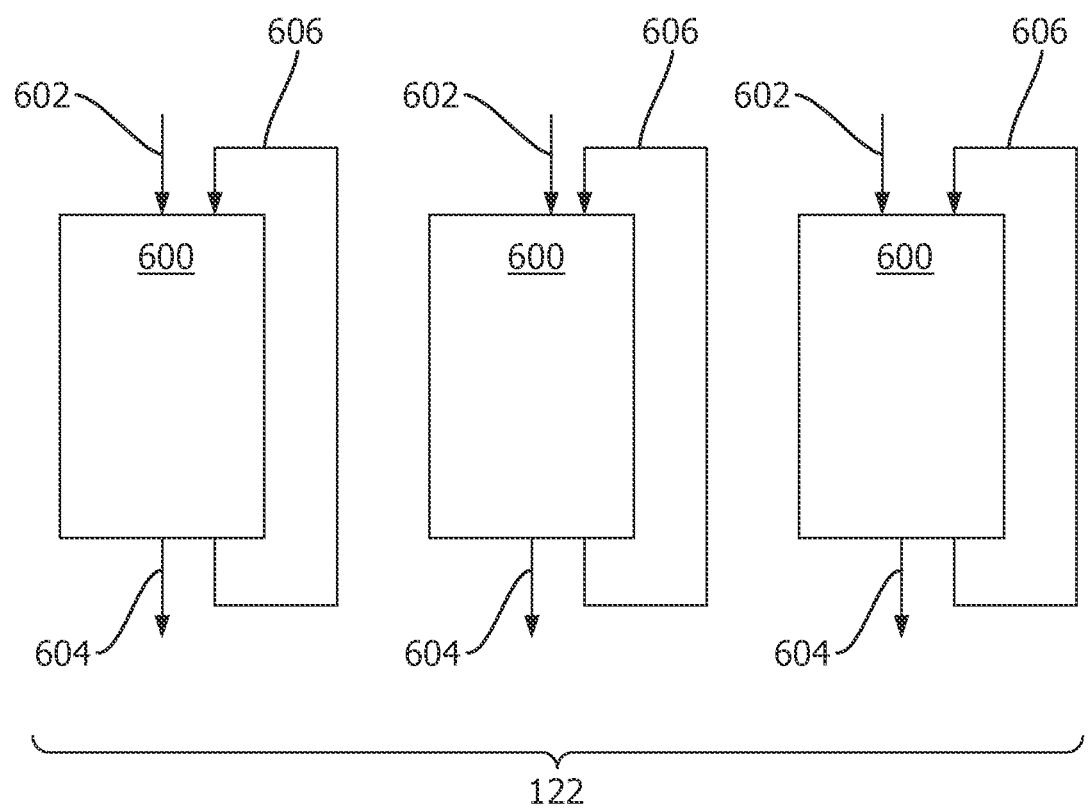
FIG. 6 illustrates an example of a configured artificial neural network.

FIG. 6 illustrates one architecture of the configured artificial neural network 122. In this example there is a recurrent neural network 600 that is assigned to each voxel of the magnetic resonance imaging data. The illustration of the recurrent neural network 600 can represent a single recurrent neural network, a recurrent neural network with multiple layers, or multiple recurrent neural networks in series. Each recurrent neural network 600 comprises an input 602 and an output 604. Each recurrent neural network 600 also comprises a direct feedback 606 or direct feedback loop which can be viewed either as a feedback signal or as connections via a hidden layer of neurons. The direct feedback 606 is illustrated as a line, but could also be illustrated as a box to represent a hidden layer or neurons. The example illustrated in FIG. 6 is the simplest architecture.

Figure 7:
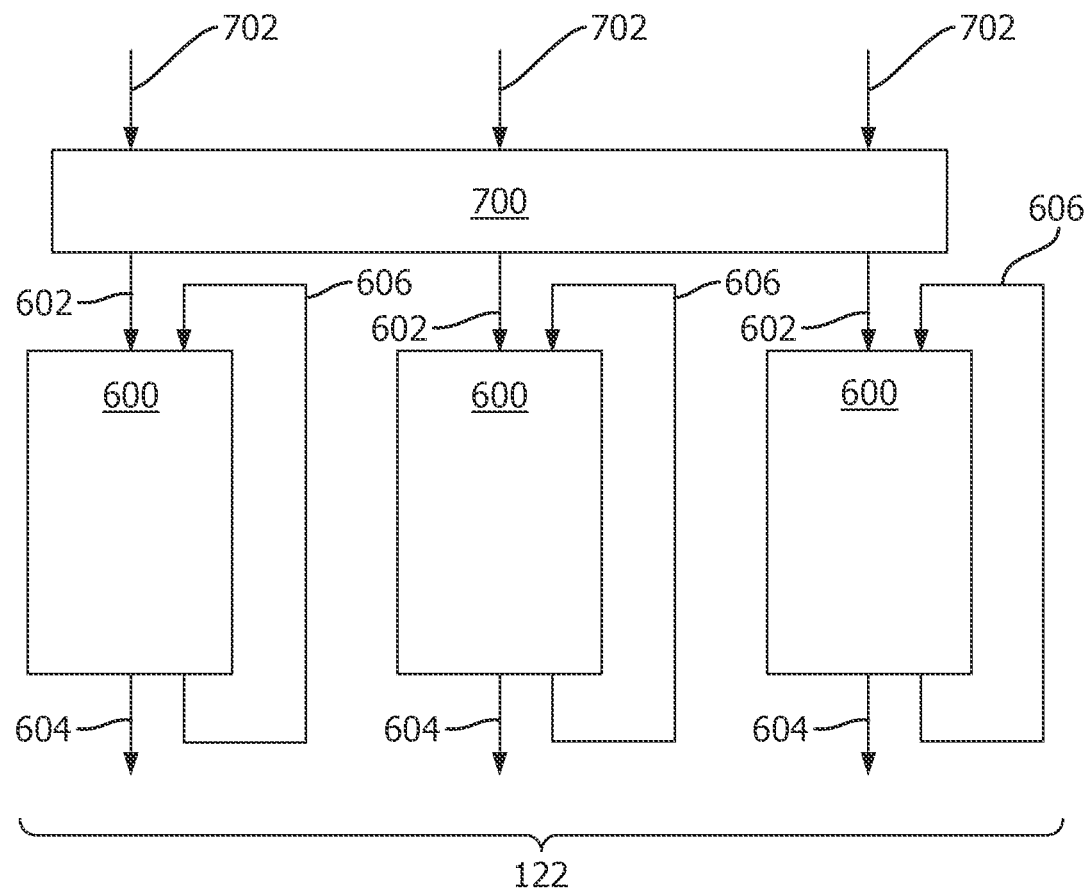
FIG. 7 illustrates a further example of a configured artificial neural network.

FIG. 7 illustrates a more complicated version of the configured artificial neural network 122. In FIG. 7 instead of the inputs of the configured artificial neural network 122 feeding directly into the individual recurrent neural networks 600, there is instead now an input computational layer 700. The input computational layer 700 has inputs 702 which function as the inputs for the configured artificial neural network 122. The output of the input computational layer 700 is then directed to the inputs of the individual recurrent neural networks 600. The input computational layer may for example be fully connected, convolutionally connected, or partially connected. The initial use of the input computational layer may assist in removing artifacts which are correlated spatially or over a number of voxels.

Figure 8:
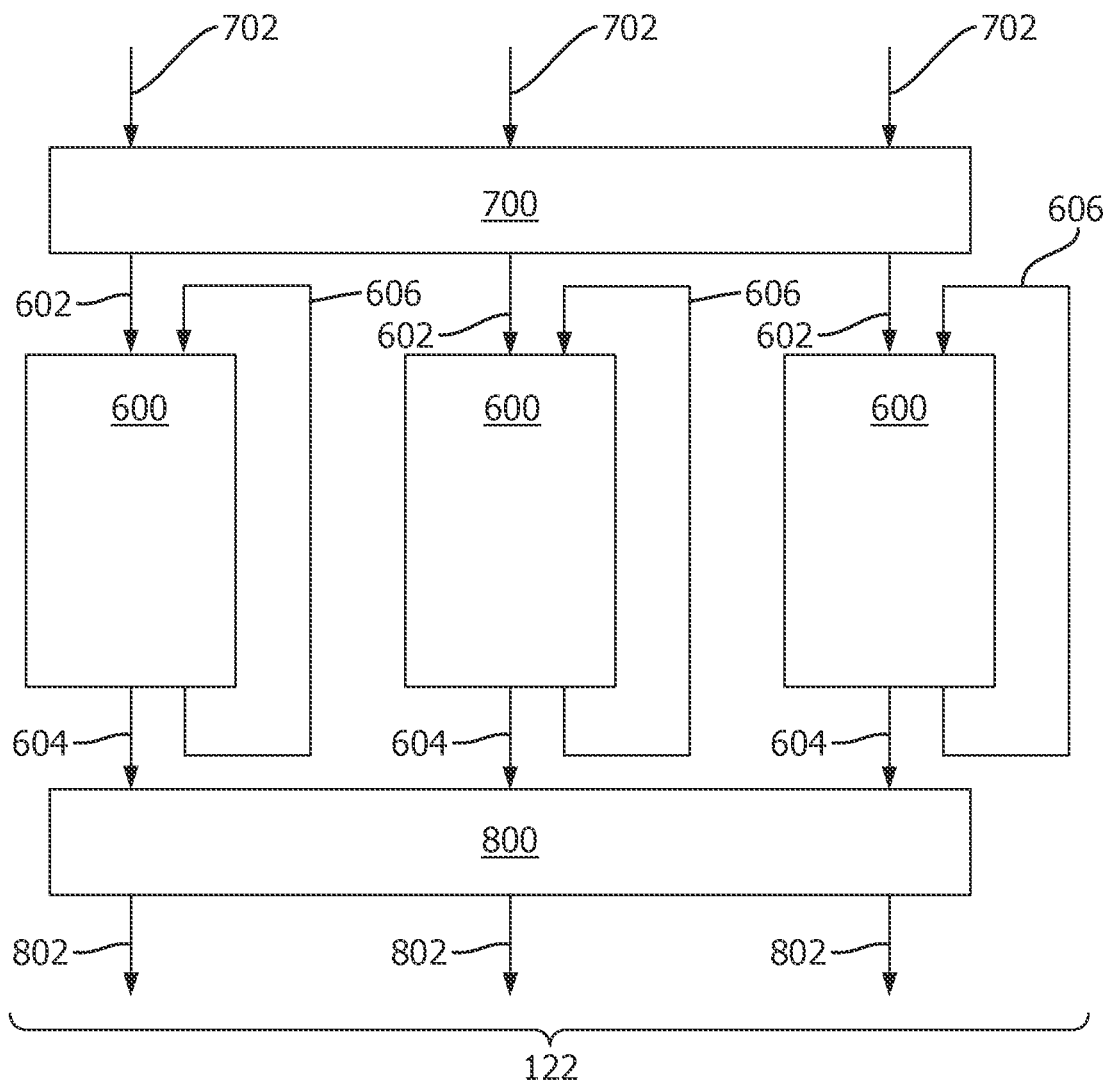
FIG. 8 illustrates a further example of a configured artificial neural network.

FIG. 8 shows a further refinement or improvement of the configured artificial neural network 122. The example illustrated in FIG. 8 is similar to that in FIG. 7 except an additional output computational layer 800 has been added. The outputs 604 of the recurrent neural networks 600 are connected to the inputs of the output computational layer 800. The output computational layer 800 then has its own outputs 802 which are the output of the overall configured artificial neural network 122. The output layer may also be a fully connected layer, a convolutionally connected layer, and a partially connected layer. The addition of the output computational layer 800 may also further improve the ability to remove noise or physiological artifacts which are correlated over a number of voxels or are spatially correlated. The example shown in FIG. 8 shows both the input computational layer 700 and the output computational layer 800. The input computational layer 700 may be removed from the example shown in FIG. 8.

Figure 9:
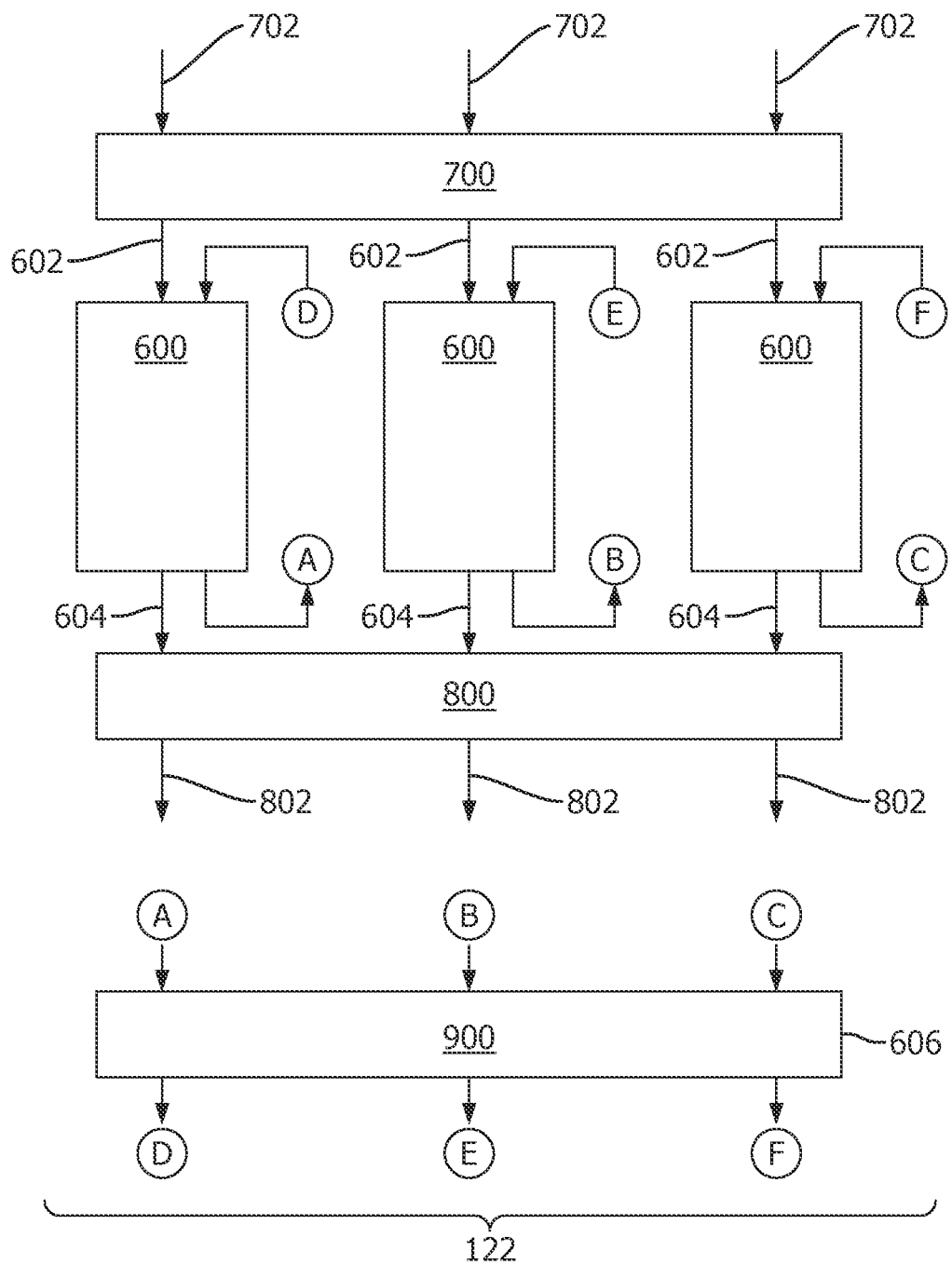
FIG. 9 illustrates a further example of a configured artificial neural network.

FIG. 9 shows a further example of a configured artificial neural network 122. The example illustrated in FIG. 9 is similar to the example illustrated in FIG. 8 with the exception that the direct feedback 606 or hidden layer neurons are implemented as a hidden feedback layer 900. The hidden feedback layer 900 provides for a communication between the individual recurrent neural networks 600. The hidden feedback layer 900 may for example be implemented as a fully connected layer, a convolutionally connected layer, or a partially connected layer.

Functional magnetic resonance imaging (fMRI) has a large potential to benefit the clinical assessment of psychological diseases. Pathologic brain activity measured in vivo via the BOLD (Blood-oxygen-level dependency) signal has been linked to mental disorders such as depression, schizophrenia, autism and others.

However, fMRI suffers from an intrinsically low signal-to-noise ratio due to different signal artifacts, mainly of physiological nature. Pure frequency domain filtering or other artifact removal algorithms such as Independent Component Analysis (ICA) often fail due to the subject-specificity of these artifacts or require tedious user interaction. On the other hand, measuring the artifact signals is not always feasible due to limited hardware availability (e.g. respiratory belt, ECG).

Embodiments may provide for an imaging system that maps an artifact-confounded fMRI time-course to an artifact-fee time-course based on artificial neural networks (ANNs). In a first training period, fMRI data is recorded. Additionally, physiological artifacts are simultaneously recorded, e.g. with a respiratory belt, a camera, ECG or similar. The artifact signals are used to clean the BOLD time-course, e.g. using a simple regression technique. Given the artifact-confounded and the clean signal, a recurrent deep neural network is trained to map from the first to latter. Providing sufficiently many and well-cleaned data sets, the algorithm will be able to automatically clean the data for unseen data sets.

Furthermore, an external parameter controlled by the user in a GUI setting controls the strength of cleaning. Either the user sets a 'strong cleaning' which might also remove valid data parts, or a 'weak cleaning' which might lead to residual artifacts.

Functional magnetic resonance imaging (fMRI) has a large potential to benefit the clinical assessment of psychological diseases, e.g. for disease classification, treatment selection, or disease progression prognosis. Pathologic brain activity measured in vivo via the BOLD (Blood-oxygen-level dependency) signal has been linked to mental disorders such as depression, schizophrenia, autism and others.

As was mentioned earlier, fMRI suffers from an intrinsically low signal-to-noise ratio and is therefore prone to many different signal artifacts, mainly of physiological nature. Whereas thermal and system noise scales linearly with the static field strength, physiological artifacts scale by the power of two.

Recent automatic artifact reduction techniques such as frequency domain filtering or Independent Component Analysis (ICA) often fail due to the subject-specificity of these artifacts, e.g. signal frequency and shape. In order to improve these approaches tedious manual work and expert knowledge is required. On the other hand, measuring the artifact signals is not always feasible due to limited hardware availability (e.g. respiratory belt, ECG) in the appropriate setting.

Examples may provide for an imaging system that maps an artifact-confounded fMRI time-course to an artifact-fee time-course based on artificial neural networks (ANNs). In a first training period, fMRI data is recorded. Additionally, physiological artifacts are simultaneously recorded, e.g. with a respiratory belt, a camera, ECG or similar kind of sensors. The artifact signals are used to clean the BOLD time-course, e.g. using a simple linear regression technique. Given the artifact-confounded and the clean signal, a recurrent deep neural network is trained to map from the first to latter. Providing sufficiently many and well-cleaned data sets, the algorithm will be able to automatically clean the data for unseen data sets.

Furthermore, one can think of an external parameter controlled by the user in a graphical user interface (GUI) to set the cleaning level. Either the user sets a 'high cleaning level' which might also remove valid data parts, or a weak cleaning level which might lead to some remaining residual artifacts.

Figure 10:
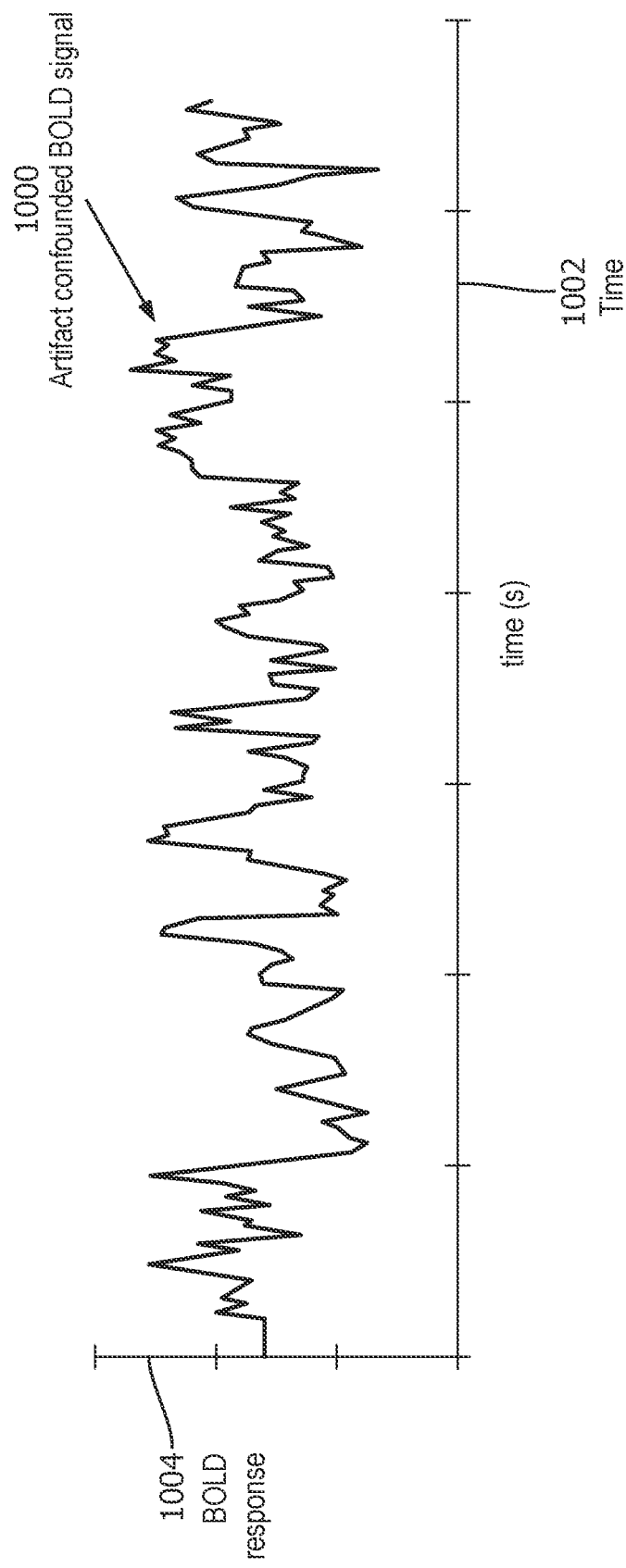
FIG. 10 illustrates an example of a time dependent functional magnetic resonance imaging signal with noise.
Figure 11:
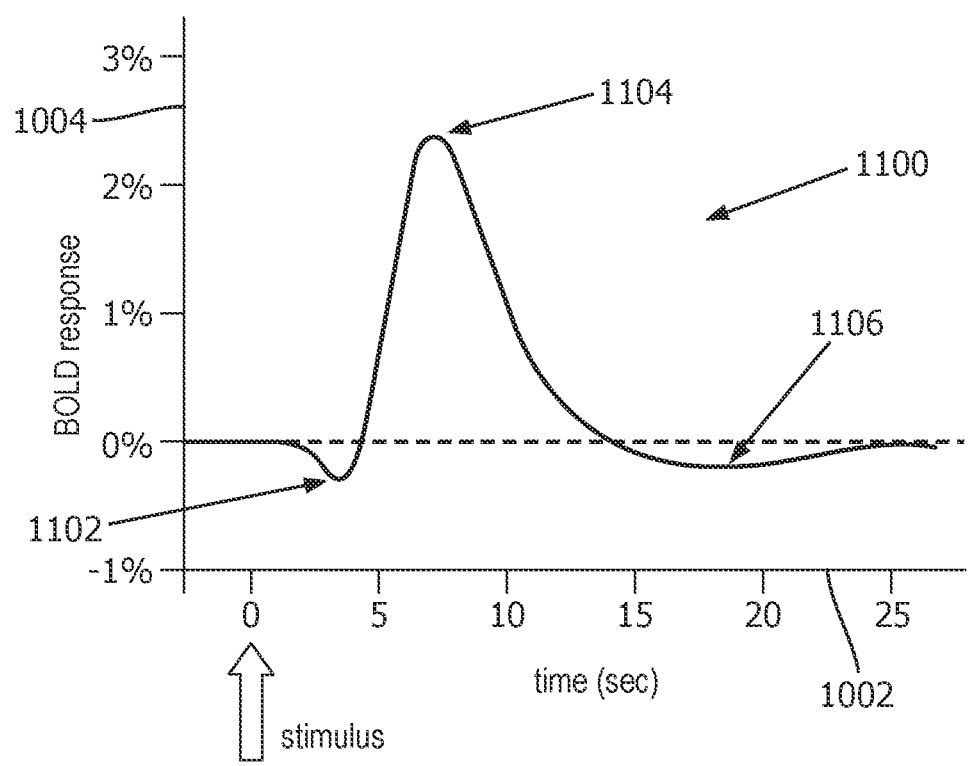
FIG. 11 illustrates an idealization of a time dependent functional magnetic resonance imaging signal without noise.

In order to build the invention, artifact-free fMRI training data is provided. A large number of acquired fMRI BOLD time series are used mays for example be manually cleaned. These time series originate from a large number of subjects, and different brain regions and vary in their time duration. The cleaning can be achieved in a prior step e.g. by visual inspection of the spectrum and filtering in the appropriate band, using ICA or other techniques like regression. Additionally, one can measure the artifact signals, e.g. with a respiratory belt and ECG. Given the measured signal, one could regress it out of the BOLD signal. FIGS. 10 and 11 shows examples of an artifact confounded signal and an ideal artifact-free BOLD signal. For data augmentation, one can also combine the artifact signal from one subject with the clean BOLD signal from another subject.

FIG. 10 shows a plot which illustrates an idealized BOLD response 1000 for a single voxel. The x-axis is the time 1002 and the y-axis 1004 is the BOLD response. It can be seen by examining the signal in FIG. 10 that it is extremely noisy and it is not possible to interpret or see the BOLD signal.

FIG. 11 illustrates an idealized artifact-free BOLD signal 1100. It can be seen that the artifact-free BOLD signal 1100 has an initial dip 1102, a peak 1104, and a post-stimulus undershoot 1106. This is not visible in FIG. 10.

Given many paired time-series, one can train a recurrent neural network (RNN) to learn a mapping y=f(x) from the artifact-confounded time-series x(t) to the artifact-free time-series y(t). In its simplest form, an RNN can be seen as a fully connected neural network unrolled in the time domain, see FIG. 12 below. In this example, only a single neuron is present for each instance of time and only two parameters are learned. Assuming the hyperbolic tangent as the activation function, the transfer function becomes $y_t=\tanh(wy_{t-1}+ux_t)$, where w and u are the learnable parameters.

Figure 12:
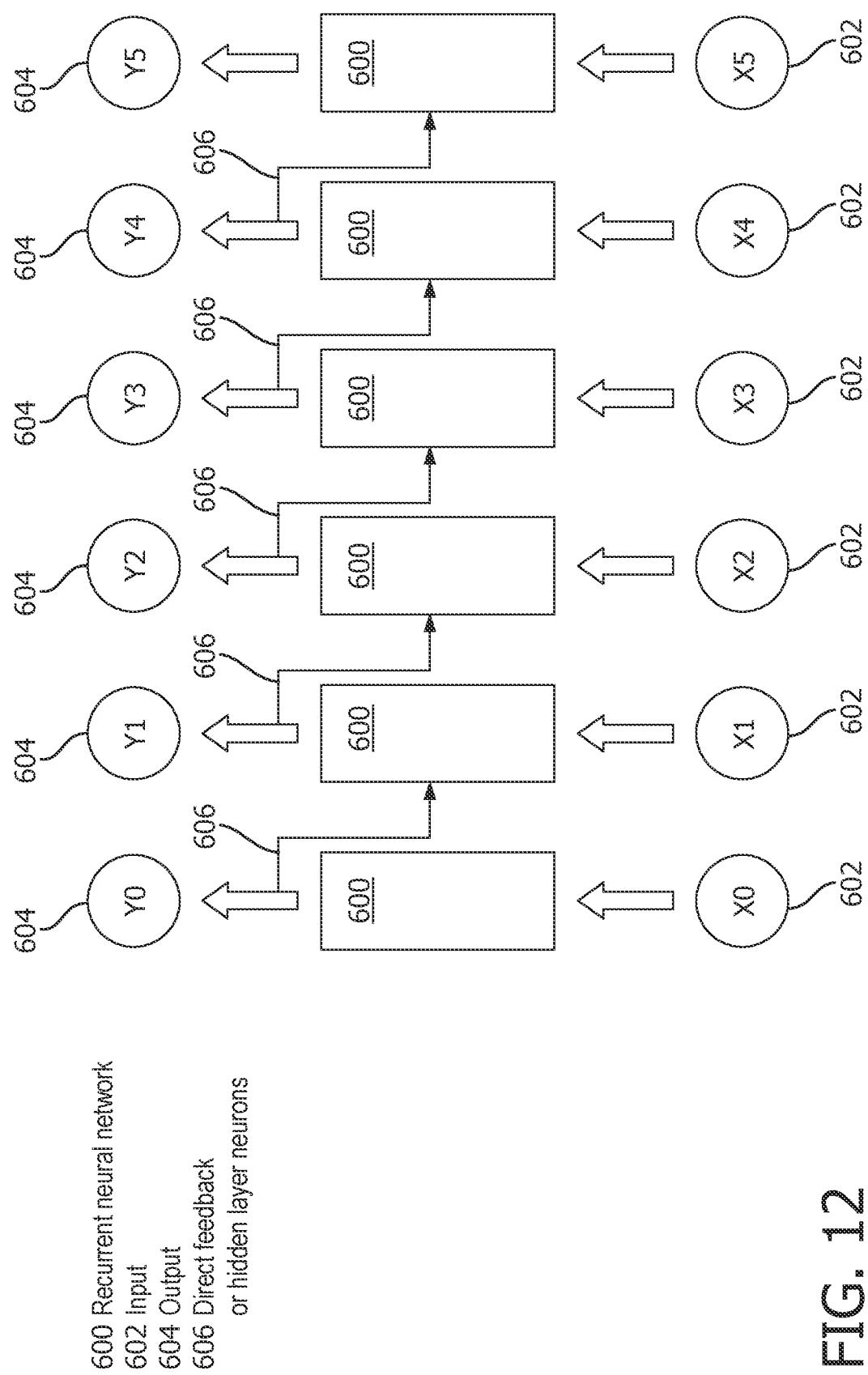
FIG. 12 illustrates an example of an unrolled recurrent neural network.

FIG. 12 shows the operation of a single recurrent neural network 600 that represents one voxel over a period of multiple time periods. This illustrates a so-called unrolling process or it is an image of the recurrent neural network 600 unrolled in time. The various inputs 602 and 604 represent inputs into the same recurrent neural network 600 but at subsequent time intervals.

This simple scenario only serves illustration purposes, i.e. how a neural network can be used to learn the mapping between time series. Network complexity can (and must) be increased by stacking more of these described units onto each other leading to a deep artificial neural network. This will enable the network to properly learn the complex structure of multiple artifacts and, eventually, to regress it out from the signal. Additionally, one could think of a hierarchical architecture, where first, the artifact signal itself is learned by an RNN and then, fed into a second network responsible to regress out the artifact signal in a non-linear fashion from the original BOLD series. For the second network, an additional parameter can be introduced controlling the strength of regression. This way the user has the possibility to either rather allow false positives (weak regression leads to remaining artefacts) or false negatives (strong regression leads to a falsely removed true BOLD signal).

Figure 13:
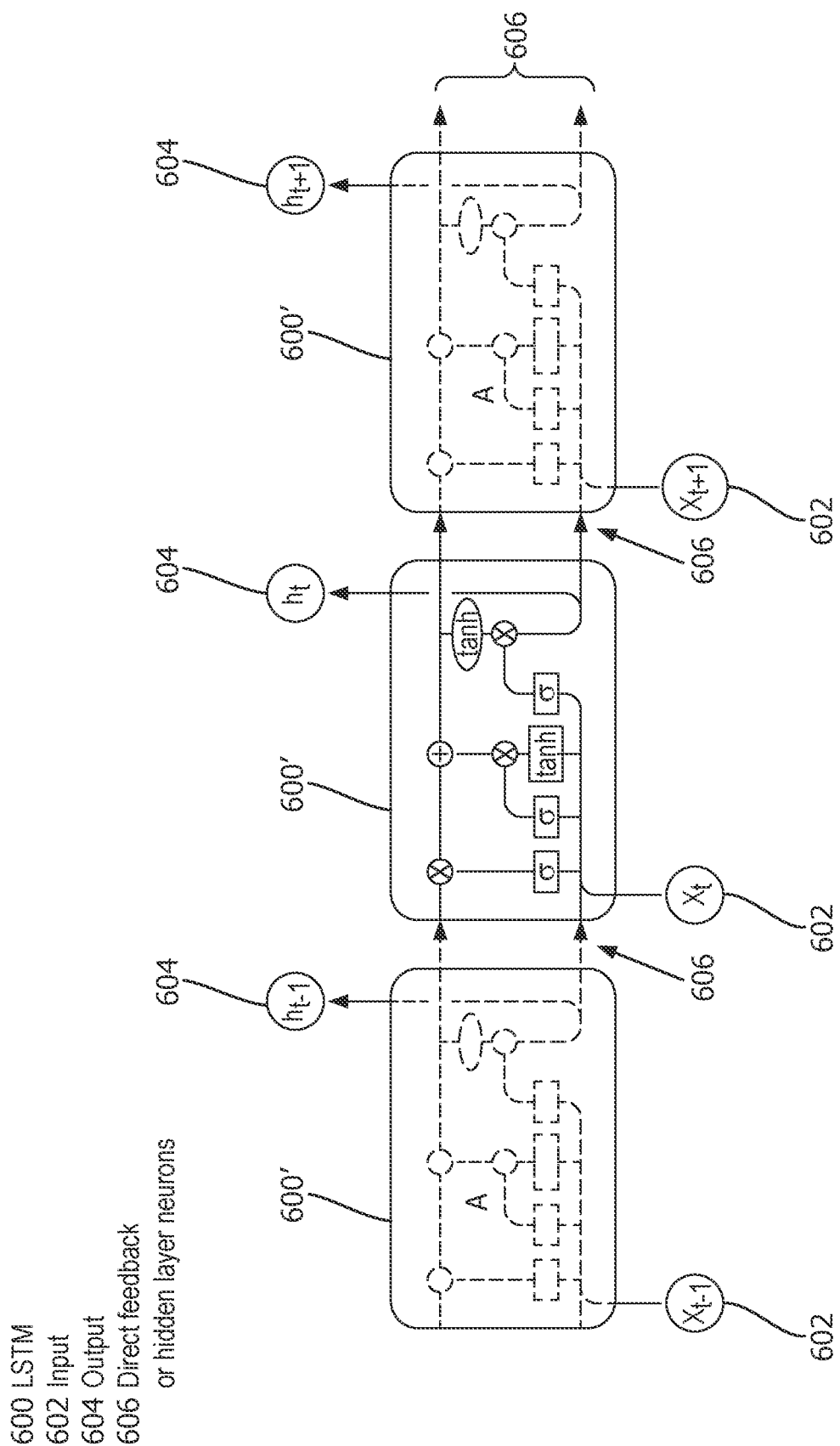
FIG. 13 illustrates an example of an unrolled LSTM neural network.

One drawback of the approach outlined above is that the time dependency is only captured up to a single point in time. However, to learn long-term dependencies, such as breathing and heart beat artefacts, one needs a more sophisticated architecture. One approach would be long short-term memory (LSTM) networks as the RNNs. FIG. 13 shows the architecture of these more complex units, which have an internal state variable that is modified by different operational gates (input gates, forget gates, output gates).

FIG. 13 illustrates the replacement of a simple recurrent neural network 600 with a so-called LSTM network. This is a long short-term memory network. The LSTM 600' may be used to replace the recurrent neural network 600 illustrated in the other examples. In FIG. 13 the LSTM 600' is for a single voxel again. As with FIG. 12, the LSTM 600' is shown as being unrolled in time.

In a further example one could consider to expand the scope of confounding artefact removal also to those generated by the recording systems (the MRI, the ECG, the motion sensors, etc.) and their potential undesired cross-talk. Vendors usually take care to ensure perfect image/data quality during the entire course of an fMRI experiment but system heating and other temporal effects can slightly influence data quality. Also, the interplay of the strong gradients, applied in the MRI, can have adverse effects on the concurrent readings of the other sensors like the ECG. This information could also be fed in a deep learning system to remove those effects as well.

Examples may be used as a first step in the analysis of an fMRI data set. After data acquisition, the user is presented the data and processing options in a graphical user interface. Among the processing options, the user can choose "automatic artefact removal" and additionally set a parameter controlling the strength of the artifact removal.

Further examples may have one or more of the following properties or features:

An automatic preselection of optimal filter parameters, without user interaction, based on Statistical analysis of a large general data set (e.g. used for training the ANN).

Statistical analysis of the specific data acquired on site because the various acquired signals likely have different properties and might be operator and equipment type dependent.

Adaptive selection of parameters based on used fMRI sequences.

Adaptive selection of parameters based on used the equipment types used (specific differences originating from technology differences e.g. ECG vs. VCG vs. camera systems as well as Vendor equipment differences).

Using gated recurring units (GRUs) as one special class of LSTMs to reduce the number of parameters that need to be trained as well as to reduce training time.

Increase the depth of the "ANNs" to increase the expressive power (e.g. better separation of learning slow and fast changing dynamics).

Using shortcut connections e.g. for faster gradient flow during back propagation.

Stacking of two ANNs on top of each other to increase the expressing power and learning capacity of the network.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

Figure 14:
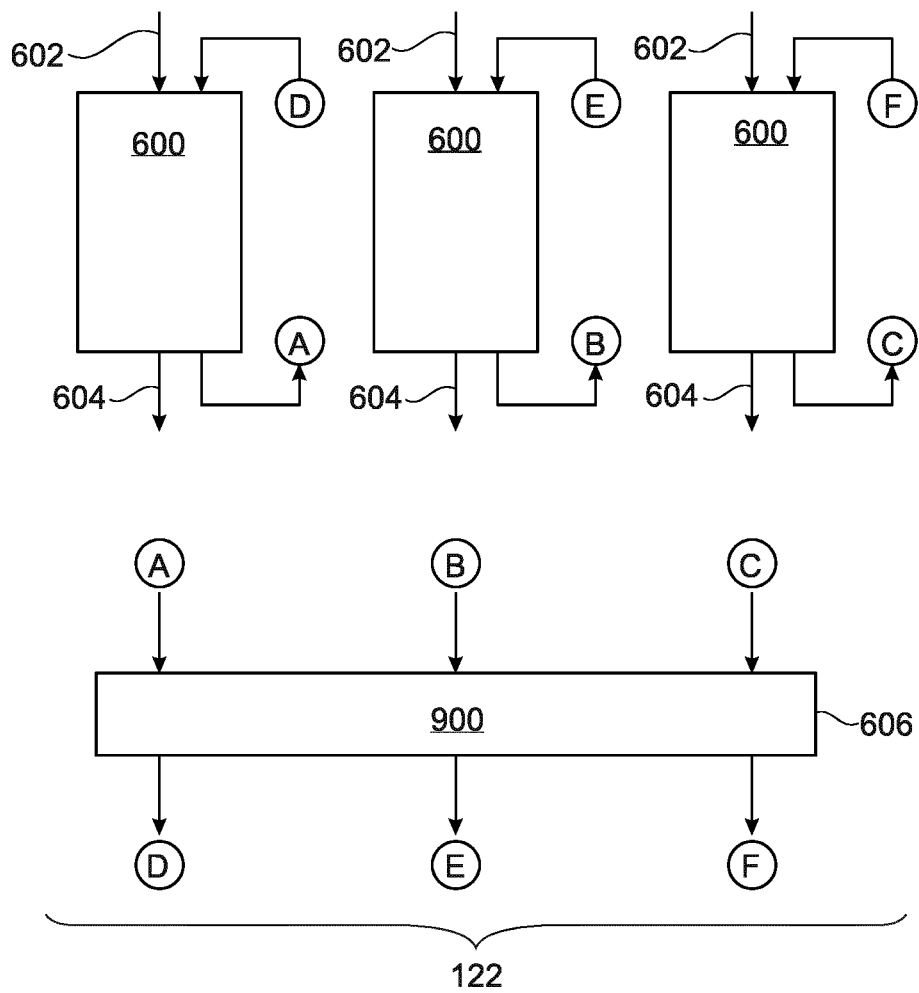
FIG. 14 illustrates a further example of a configured artificial neural network.

FIG. 14 illustrates a further example of a configured artificial neural network 122. The example illustrated in FIG. 14 is similar to the example illustrated in FIG. 8 with the exception that the input layer 700 and the output layer 800 are absent. The set of initial signals are input directly into the input 602 of the recurrent neural networks 600. The set of modified signals is output directly by the output 604 of the recurrent neural networks 600. There is a recurrent neural network 600 for each voxel of the set of voxels. The hidden feedback layer 900 provides for a communication between the individual recurrent neural networks 600. The hidden feedback layer 900 may for example be implemented as a fully connected layer, a convolutionally connected layer, or a partially connected layer. The hidden feedback layer 900 enables the configured artificial neural network to remove physiological artifacts that are spatially correlated between different voxels.

LIST OF REFERENCE NUMERALS 100 medical imaging system
102 computer
104 processor
106 hardware interface
108 user interface
110 memory
120 machine executable instructions
122 configured artificial neural network
124 magnetic resonance imaging data
126 set of initial signals 128 set of modified signals
130 functional magnetic resonance image
200 receive magnetic resonance imaging data
202 construct a set of initial signals by reconstructing the time dependent signal for each of the set of voxels using the magnetic resonance imaging data
204 receive a set of modified signals in response to inputting the set of initial signals into a configured artificial neural network, wherein the configured artificial neural network is configured for removing physiological artifacts from the set of initial signals
300 receive a set of training signals for each of the set of voxels
302 receive a set of clean signals for each of the set of voxels
304 receive physiological artifact data descriptive of subject motion
306 train the configured artificial neural network using the set of training signals, the clean signals, and the physiological artifact data.
400 medical imaging system
402 magnetic resonance imaging system
404 magnet
406 bore of magnet
408 imaging zone
409 region of interest
410 magnetic field gradient coils
412 magnetic field gradient coil power supply
414 radio-frequency coil
416 transceiver
418 subject
420 subject support
430 pulse sequence commands
500 control the magnetic resonance imaging system to acquire the magnetic resonance imaging data.
600 recurrent neural network
600 LSTM
602 input
604 output
606 direct feedback or hidden layer neurons
700 input computational layer
702 inputs of layer inputs
800 output computational layer
802 outputs of output computational layer
900 connected hidden layer
1000 artifact confounded BOLD signal
1002 time
1004 BOLD response
1100 idealized artifact free bold signal
1102 initial dip
1104 peak
1106 post stimulus undershoot

The invention claimed is:

1. A medical imaging system comprising:
a memory storing machine executable instructions and a configured artificial neural network;
a processor configured for controlling the medical imaging system by executing of the machine executable instructions, wherein execution of the machine executable instructions causes the processor to:
receive magnetic resonance imaging data, wherein the magnetic resonance imaging data is blood-oxygen-level dependent (BOLD) functional magnetic resonance imaging data descriptive of a time dependent BOLD signal for each of a set of voxels, wherein the configured artificial neural network comprises a recurrent neural network for each of the set of voxels;
construct a set of initial signals by reconstructing the time BOLD dependent signal for each of the set of voxels using the magnetic resonance imaging data wherein the set of initial signals is the time dependent BOLD signal for each voxel; and
receive a set of modified signals from the configured artificial neural network in response to inputting the set of initial signals into the configured artificial neural network, the set of modified signals is either a pure noise signal from the set of initial signals or the set of modified signals with the pure noise signal removed, wherein the configured artificial neural network is configured for removing physiological artifacts from the set of initial signals, wherein the configured neural network comprises a plurality of recurrent neural networks, wherein for each of the set of voxels there is an individual recurrent neural network, and wherein the independent recurrent neural network of each of the set of voxels form the plurality of recurrent neural networks.

2. The medical imaging system of claim 1, wherein the medical imaging system further comprises a magnetic resonance imaging system configured for acquiring the magnetic resonance imaging data according to a time dependent functional magnetic resonance imaging protocol, wherein execution of the machine executable instructions further causes the processor to control the magnetic resonance imaging system to acquire the magnetic resonance imaging data.

3. The medical imaging system of claim 1, wherein the configured artificial neural network comprises an input computational layer, wherein the recurrent neural network of each voxel comprises an input connected to the input computational layer.

4. The medical imaging system of claim 3, wherein the input computational layer is at least one of the following:
fully connected; or
convolutionally connected.

5. The medical imaging system of claim 1, wherein the configured artificial neural network comprises an output computational layer, wherein the recurrent neural network of each voxel comprises an output connected to the output computational layer.

6. The medical imaging system of claim 5, wherein the output computational layer is at least one of the following:
fully connected;
convolutionally connected; or
partially connected.

7. The medical imaging system of claim 1, wherein the recurrent neural network of each voxel comprises a direct feedback, wherein the configured artificial neural network comprises a hidden feedback layer, wherein the direct feedback of the recurrent neural network of each voxel is provided via the hidden feedback layer.

8. The medical imaging system of claim 1, wherein execution of the machine executable instructions further causes the processor to:
receive a set of training signals for each of the set of voxels;
receive a set of clean signals for each of the set of voxels, wherein the set of training signals comprises the set of clean signals plus physiological artifacts;

receive physiological artifact data descriptive of subject motion, wherein the physiological artifact data is time correlated to the set of clean signals;

train the configured artificial neural network using the set of training signals, the clean signals, and the physiological artifact data.

9. The medical imaging system of claim 1, wherein execution of the machine executable instructions further causes the processor to:

receive a noise reduction value; and construct a controllably cleaned set of signals using the set of initial signals, the set of modified signals, and the noise reduction value.

10. The medical imaging system of claim 9, wherein any one of the following:

wherein if the set of modified signals is a set of noise signals then constructing the controllably cleaned set of signals comprises subtracting the multiple of the noise reduction value times the set of modified signals from the set of initial signals; and wherein if the set of modified noise signals is a set of cleaned signals then constructing the controllably cleaned set of signals comprises:

calculating a set of noise signals by subtracting the set of modified signals from the set of initial signals; and constructing the controllably cleaned set of signals by subtracting the multiple of the noise reduction value times the set of noise signals from the set of initial signals.

11. The medical imaging system of claim 9, wherein execution of the machine executable instructions further causes the processor to reconstruct a functional magnetic resonance image from the controllably cleaned set of signals.

12. The medical imaging system of claim 1, wherein the recurrent neural network for each of the set of voxels is a Long Short-Term Memory neural network.

13. A method of operating a medical imaging system, wherein the method comprises:

receiving magnetic resonance imaging data, wherein the magnetic resonance imaging data is blood-oxygen-level dependent (BOLD) functional magnetic resonance imaging data descriptive of a time dependent BOLD signal for each of a set of voxels;

constructing a set of initial signals by reconstructing the time dependent BOLD signal for each of the set of voxels using the magnetic resonance imaging data; wherein the set of initial signals is the time dependent BOLD signal for each voxel and receiving a set of modified signals from a configured artificial neural network in response to inputting the set of initial signals into the configured artificial neural network, wherein the configured artificial neural network is configured for removing physiological artifacts from the set of initial signals, the set of modified signals is either a pure noise signal from the set of initial signals or the set of modified signals with the pure noise signal removed wherein the configured artificial neural network comprises a recurrent neural network for each of the set of voxels, wherein the configured artificial neural network comprises a plurality of recurrent neural networks, wherein for each of the set of voxels there is an individual recurrent neural network, and wherein the independent recurrent neural network of each of the set of voxels form the plurality of recurrent neural networks.

14. A computer program product comprising machine executable instructions stored on a non-transitory computer readable medium for execution by a processor an implementation of a configured artificial neural network, wherein execution of the machine executable instructions causes the processor to:

receive magnetic resonance imaging data, wherein the magnetic resonance imaging data is blood-oxygen-level dependent (BOLD) functional magnetic resonance imaging data descriptive of a time dependent BOLD signal for each of a set of voxels;

construct a set of initial signals by reconstructing the time dependent BOLD signal for each of the set of voxels using the magnetic resonance imaging data; wherein the set of initial signals is the time dependent BOLD signal for each voxel and receive a set of modified signals from the configured artificial neural network in response to inputting the set of initial signals into the configured artificial neural network, wherein the configured artificial neural network is configured for removing physiological artifacts from the set of initial signals, wherein the set of modified signals is either a pure noise signal from the set of initial signals or the set of modified signals with the pure noise signal removed, wherein the configured artificial neural network comprises a recurrent neural network for each of the set of voxels, wherein the configured neural network comprises a plurality of recurrent neural networks, wherein for each of the set of voxels there is an individual recurrent neural network, and wherein the independent recurrent neural network of each of the set of voxels form the plurality of recurrent neural networks.

* * * * *